United States Patent [19]

Shrivastava

[11] Patent Number: 5,416,738
[45] Date of Patent: May 16, 1995

[54] SINGLE TRANSISTOR FLASH EPROM CELL AND METHOD OF OPERATION

[75] Inventor: Ritu Shrivastava, Fremont, Calif.

[73] Assignee: Alliance Semiconductor Corporation, San Jose, Calif.

[21] Appl. No.: 250,171

[22] Filed: May 27, 1994

[51] Int. Cl.[6] ............................................. G11C 13/00
[52] U.S. Cl. ................................... 365/185; 365/218; 365/900; 365/189.09
[58] Field of Search ................ 365/182, 185, 218, 900, 365/226, 189.01, 189.09

[56] References Cited

U.S. PATENT DOCUMENTS

| | | |
|---|---|---|
| 4,203,158 | 5/1980 | Frohman-Bentchkowsky et al. |
| 4,274,012 | 6/1981 | Simko. |
| 4,599,706 | 7/1986 | Guterman. |
| 4,698,787 | 10/1987 | Mukherjee et al. |
| 4,958,321 | 9/1990 | Chang. |
| 5,021,848 | 6/1991 | Chiu. |
| 5,053,990 | 10/1991 | Kreifels et al. |
| 5,077,691 | 12/1991 | Haddad et al. |
| 5,194,925 | 3/1993 | Ajika et al. |
| 5,198,380 | 3/1993 | Harari. |
| 5,220,528 | 6/1993 | Mielke. |
| 5,220,533 | 6/1993 | Turner. |
| 5,222,040 | 6/1993 | Challa. |
| 5,233,526 | 8/1993 | Detriche et al. |
| 5,267,194 | 11/1993 | Jang ..................................... 365/900 |

OTHER PUBLICATIONS

Yamada, Seiji et al., "A Self-Convergence Ereasing Scheme For A Simple Stacked Gate Flash EEPROM", 1991 IEEE, IEDM 91-307, pp. 11.4.1–11.4.4.
Yoshikawa, Kuniyoshi et al., "Comparison of Current Flash EEPROM Erasing Methods: Stability and How to Control", 1992 IEEE, IEDM 92-595, pp. 24.2.1–24.4.4.
Aritome, Seiichi, "Reliability Issues of Flash Memory Cells", 1993 IEEE, Proceedings of the IEEE, vol. 81, No. 5, May 1993, pp. 776-788.

*Primary Examiner*—Terrell W. Fears
*Attorney, Agent, or Firm*—Limbach & Limbach

[57] ABSTRACT

A flash EPROM memory cell array includes a plurality of flash cells arranged as a matrix of rows in columns of said cells. Each cell includes a single transistor. For each row of flash cells in the matrix, a corresponding bit line is connected to the drain region of each memory cell transistor in that row. For each column of flash cells, a corresponding wordline is connected to the control gate of each memory cell transistor in that column. Bias circuitry is provided for applying read bias voltages to the array for reading data from a selected cell in the matrix. The read bias circuitry includes means for applying a first control gate voltage to the wordline connected to the control gate of the selected cell and the second control gate voltage to the deselected wordlines. The first control gate voltage is positive and higher than the highest erased threshold voltage from the erased cell threshold voltage distribution and less than the lowest programmed threshold voltage from the programmed cell threshold distribution such that programmed cells in the selected row are shut off with insignificant drain current conduction. The second control gate voltage is less than the lowest erased threshold voltage such that erased cells connected to deselected wordlines are shut off with insignificant drain current conduction when the second control gate voltage is applied to the gates of the erased cells, even if the erased cells are overerased to negative threshold voltages.

13 Claims, 6 Drawing Sheets

Erase:
- Vs=12V pulses (common source)
- Vg=0V
- Vd=floating
- Electrons tunnel from FG to source
- FG gets erased ... Vt~2V Program (Selected Cell):
- Start with erased cell (Vt~2V)
- Vs=0V (common)
- Vd=6V
- Vg=12V
- FG gets -ve charge ... Vt~6V Read:
- Vs=0V (common)
- Vd=1V
- Vg=5V for selected WL
- Vg=0V for unselected WL
- Low Vt ... ON state ... "1"
- High Vt ... OFF state ... "0"

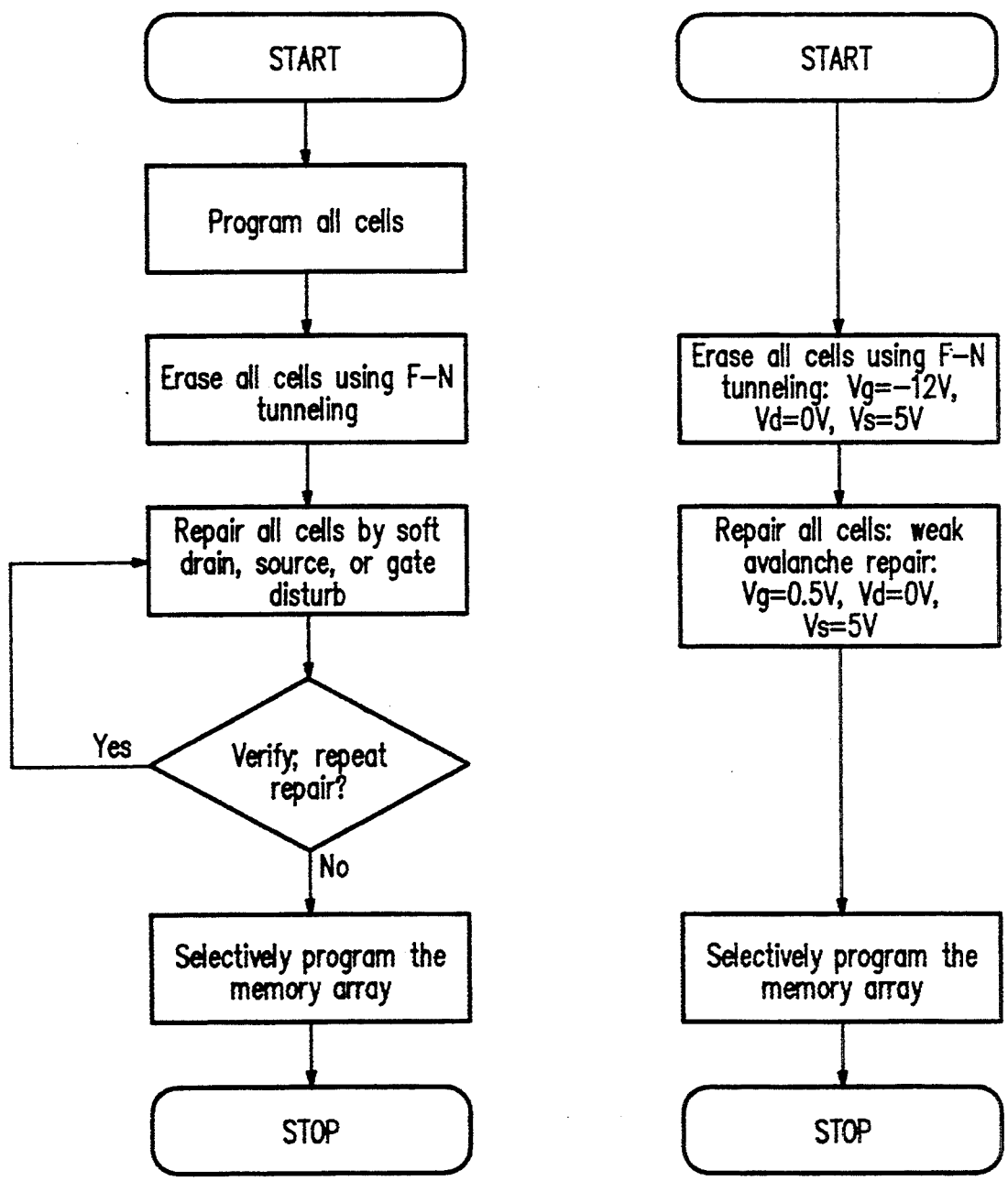

SINGLE TRANSISTOR FLASH EPROM CELL AND METHOD OF OPERATION

TECHNICAL FIELD

The present invention relates to integrated circuit memory elements and, in particular, to a single transistor flash EPROM memory cell and its method of operation within a flash EPROM array.

BACKGROUND OF THE INVENTION

Non-volatile electrically erasable integrated circuit memory devices may be categorized as EEPROMs and flash EPROMs (sometimes also called flash EEPROMs). EEPROMs utilize the wellknown Fowler-Nordheim tunneling mechanism for both programming and erase. In contrast, flash EPROMs utilize hot-electron injection for programming and Fowler-Nordheim tunneling for erase.

U.S. Pat. No. 4,203,158, discloses a typical EEPROM floating gate cell based on Fowler-Nordheim tunnelling. The area of the cell disclosed in the '158 patent is relatively large due to the need for a separate select transistor for each storage cell site. Programming through the thin tunnel oxide utilized between the substrate and the floating gate in this cell design can also result in reliability and manufacturing problems.

U.S. Pat. Nos. 4,274,012 and 4,599,706 try to overcome the problems of the '158 patent cell by replacing the thin tunnel oxide with a relatively thick oxide between poly layers. The thick interpoly oxide layer has an enhanced electrical field due to asperities on the surface of the polycrystalline silicon floating gate, as described in the '158 patent. However, this type of device requires three layers of polycrystalline silicon and relies on much higher voltages, both of which can result in manufacturing problems.

Typical EEPROM cell operation is shown in FIG. 1. The cell is "erased" by Fowler-Nordheim tunneling of electrons from the EEPROM cell's drain D to the floating gate, raising the cell threshold voltage to a positive value. Cell "programming" is achieved by Fowler-Nordheim tunneling as well, moving electrons from the floating gate to the drain D, thereby changing the threshold voltage to a negative value. As further shown in FIG. 1, this negative programming threshold requires the use of a select transistor for "reading" the cell state. The select transistor is needed because the cell transistor conduction cannot be controlled by a gate voltage in the 0–5 V range when the cell has a negative threshold.

The operating bias conditions for the FIG. 1 EEPROM cell are provided in Table I below.

TABLE I

|  | Vg, cell Control gate | Vg, sel Select gate | Vs, cell Array source | Vd, sel Bit line |
|---|---|---|---|---|
| Erase | 20 V | 20 V | 0 V | 0 V |
| Program | 0 V | 20 V | Float | 20 V |
| Read | 3 V | 5 V | 0 V | 2 V |

Various techniques for minimizing the EEPROM cell area have also been described. For example, U.S. Pat. No. 5,021,848 describes a self-aligned tunnel oxide approach. However, this cell still requires a select transistor and the process to achieve the cell structure is complicated.

Other approaches try to eliminate the select transistor. For example, U.S. Pat. No. 5,222,040 describes a method of eliminating the select transistor in an EEPROM cell by using a negative read voltage, such as −3 V. Threshold values for an EEPROM cell based on tunnel program and erase have an average value around −2 V after programming with a spread which depends on manufacturing control (typically 1–2 V). It is very likely that the threshold values for some cells will be below the read voltage despite a negative read voltage. If such is the case, then the single transistor EEPROM cell is functionality impaired. Also, high voltages in the range of 15–20 volts are required on the gates of the cell.

It should be noted that the object of the '040 patent was to produce a single transistor EEPROM cell, i.e., a cell based on tunnel programming and erase, by eliminating the need for a select transistor. U.S. Pat. No. 5,194,925 uses a triple-poly approach for achieving a single transistor cell, resulting in a complicated process.

In summary, the problem with an EEPROM cell approach, in general, is that a select transistor is invariably required, and the existing art to minimize the EEPROM cell size by eliminating the select transistor results in more complicated processes, difficult control of the separation between the read voltage and programmed negative cell threshold voltage, and the use of high gate voltages.

A flash EPROM utilizes a single transistor cell for high density memory applications. As stated above, a flash EPROM cell is programmed by hot electron injection like a conventional UV-erasable EPROM cell, and is erased by Fowler-Nordheim tunneling. By utilizing hot-electron programming rather than the Fowler-Nordheim mechanism, the threshold voltages in a flash EPROM cell are nominally positive. Due to the absence of negative threshold voltages, a select transistor is not needed, resulting in a single transistor cell. Such a cell is disclosed in U.S. Pat. No. 4,698,787.

Typical program, erase, and read conditions for a single transistor flash cell of the type disclosed in the '187 patent are given in FIGS. 2(a)–2(c). Each of FIGS. 2(a)–2(c) shows a cross-sectional view of a prior art flash EPROM cell and the bias conditions for its various operations.

For erasing the cell or cells, a large electric field is developed across the thin oxide, which is typically about 100 Å, between the source 25 and the floating gate 24, as illustrated in FIG. 2(a). This may be achieved by several combinations of voltage Vs on source 20 and voltage Vg on control gate 22. For example, as shown in FIG. 2(a), Vg=0 V and Vs=12 V will erase the cell by charging the floating gate 24 positive by Fowler-Nordheim tunneling, lowering the device threshold to an approximate value around 2 V (the value may be adjusted by device design). Note that the substrate 23 is at 0 V and drain 21 is floating.

An alternate erase condition may be Vg=−12 V and Vs=5 V. In this latter case, there may be modifications in the way the source 25 of the device is constructed. For example, the lightly doped n- region surrounding the source may not be required since a smaller junction breakdown voltage will suffice.

All the cells in a flash memory array can be erased together, or a subset of them can be erased at one time by choosing the appropriate method and bias conditions. As discussed above, however, the overerase problem may result in cells having negative threshold values.

The programming condition in a conventional flash EPROM cell is illustrated in the FIG. 2(b). In this case, drain 21 is taken to a voltage Vd=6 V and control gate 22 is held at a higher voltage Vg=12 V. Both source 20 and substrate 23 are held at 0 V. The resulting hot electron injection into the floating gate 24 programs the cell to a higher positive threshold, e.g., 6 V. The cells in the array that are not to be programmed can be deselected by choosing a lower Vg or Vd for these cells.

The read bias conditions for the selected cell are shown in FIG. 2(c). Drain 21 voltage Vd is at 1 V, control gate 22 voltage Vg is at 5 V, while both the source 20 and substrate 23 are held at 0 V. For an unselected cell, control gate voltage Vg is held at 0 V. This is precisely what causes the problem with overerased cells. Table II provides a summary of this type of prior art single transistor cell bias conditions. Another type of prior art single transistor cell implementation is summarized in Table III.

TABLE II

|  | Vd Bitline | Vg Control Gate | VS Source |
| --- | --- | --- | --- |
| Read-select | 1 V | 5 V | 0 V |
| Read-desel | 0 V | 0 V | 0 V |
| Erase-whole array | Floating | 0 V | 12 V |
| Program-sel | 6 V | 12 V | 0 V |
| Program-desel | 0 V | 0 V | 0 V |

TABLE III

|  | Vd Bitline | Vg Control Gate | VS Source |
| --- | --- | --- | --- |
| Read-select | 1 V | 5 V | 0 V |
| Read-desel | 0 V | 0 V | 0 V |
| Erase-select | 5 V | −12 V | 5 V |
| Erase-desel | 5 V | 0 V | 5 V |
| Program-sel | 6 V | 12 V | 0 V |
| Program-desel | 0 V | 0 V | 0 V |

The cell shown in FIGS. 2(a)-2(c) has the advantage of small cell size and simple process. However, in practice, it has been found that a few out of a large number of such cells in a flash memory application result in an "over-erase" condition, which results in a negative cell threshold voltage tail (e.g., see S. Aritome et. al., "Reliability issues of Flash Memory Cells," Proc. IEEE, vol. 81, No. 5, May 1993, pp. 776-787). This occasional erratic negative cell threshold voltage due to overerase causes problems with the functionality of the cell and has plagued the manufacturability of flash EPROMS.

Several techniques for overcoming this problem have been reported. One technique is to use a split-gate cell. A good review of the existing art can be found in U.S. Pat. No. 5,198,380. These approaches, in general, provide larger cell size than a single transistor stacked gate flash cell such as that described in the '787 patent.

Other techniques utilize additional devices or circuits. U.S. Pat. No. 5,053,990 discloses an iterative design technique to reduce overerase. U.S. Pat. No. 5,233,562 discloses a soft-disturb repair technique normally used in association with an iterative routine. U.S. Pat. No. 5,220,528 discloses a design that incorporates an extra MOS device connected to the drain. U.S. Pat. No. 5,220,533 discloses a high impedance device to limit erase. U.S. Pat. No. 5,077,691 discloses a repair technique for selectively not erasing the memory cells of a defective row by erasing on a row-by-row basis. U.S. Pat. No. 4,958,321 describes a process technique by controlling the floating poly doping to reduce overerase. All of the above methods involve varying degrees of complexity in implementation, and many of them increase the product die size significantly. In summary, while the small cell size of the flash EPROM approach provides advantages, a better solution to the overerase problem would be very desirable.

In the prior art, as described above, avoiding the overerase problem in a flash EPROM has required both device and circuit design to center the erased threshold voltage distribution at a much higher positive voltage. The distribution typically may be centered around 2 V with spread from 0.5 V to 3.5 V, (e.g., see S. Aritome et. al., Ibid). This reduces the possibility of overerased cells with negative threshold voltages. However, higher nominal values of the erased cell threshold also lead to lower cell read currents, especially with lower power supply voltage, such as 3 V. The inability of the cells in the prior art to handle larger erased cell threshold voltage spread also forces the cell design to use lower negative gate voltages for erase, which has the detrimental effect of increasing the erase time. Also, simpler non-iterative schemes reported in the literature cannot be used (e.g., see K. Yoshikawa et. al., "Comparison of current flash EEPROM erasing methods: Stability and how to control," IEDM 1992, pp. 595-598, or S. Yamada et. al., "A self-convergence erasing scheme for a simple stacked gate flash EEPROM," IEDM 1991, pp. 307-310) because, even though they provide an improvement, these schemes do not result in tight enough erased cell threshold voltage distribution and iterative routines must be used (e.g., U.S. Pat. No. 5,233,562).

Therefore, it would be highly desirable to have available a better solution for the overerase problem in flash EPROMS. Also, it would be desirable to shift the erased threshold distribution down to a smaller threshold voltage to achieve higher read current. It would also be advantageous to avoid complicated erase-verify iterative overerase repair schemes. An improved repair algorithm which will work with the proposed solution would also be useful.

SUMMARY OF THE PRESENT INVENTION

The present invention provides a single transistor flash EPROM cell which can be used without the adverse effects of the overerase problem. The new cell also gives higher cell read current and lower power supply operation for reading the cell data. In a preferred embodiment, programming of the cell is done using a non-zero source voltage.

A flash EPROM device in accordance with the present invention includes an array of flash memory cells and a system for providing selected programming, erase, and read bias conditions for operating the device. As discussed above, in the prior art, typical read conditions for a selected flash EPROM cell are as follows: Vsub=0 V, Vs=0 V, Vg=5 V, Vd=1 V; for unselected cells, the control gate voltage Vg is always forced to 0 V. This 0 V control gate voltage causes a problem with overerased cells (which have negative threshold voltage) because of a substantial current with 0 V on the gate. According to the present invention, in a read operation, the unselected cells use a negative gate voltage, typically in the range of −3 V, thus shutting off the overerased unselected cells. The problem of charging the capacitance of a large array, and potentially slowing down the read cycle, is solved by a system of circuits which keeps all of the non-selected control gates (wordlines) in the array at a predetermined negative voltage (e.g. −3 V) at all times, and brings only the selected wordline to a positive read voltage. According to another aspect of the present invention, a soft-avalanche repair algorithm for overerase is provided. This repair permits a normal Fowler-Nordheim erasure and is non-iterative in nature.

In yet another aspect of present invention, a non-zero source voltage is used during programming to further eliminate problems caused by overerased cells during the programming operation.

An advantage of the present invention is that the functionality of the flash EPROM cell remains unaffected, even if the overerased cells have negative threshold voltages, thus overcoming one of the major problems experienced in flash EPROM manufacturing.

In addition to the above-stated advantages, the chip area of the flash memory product can be made smaller because additional circuitry to erase the cells by iterative schemes is not required and difficult modifications are not required to the fabrication process to control the overerase problem. Furthermore, a wider distribution of erased cell threshold voltages can be tolerated with a conventional power supply. This in turn allows the use of higher negative gate voltage which can increase erase speed, it being well known in the art that a higher negative gate voltage increases the spread of erased threshold voltages making the overerase problem worse for standard read conditions.

Another advantage of the invention is that the distribution of erased cell voltages can be lowered to a smaller average positive value, thus increasing the cell current for given bias conditions, thus improving the access time. Also, the distribution of erased cell voltages can be lowered to a smaller average positive value, thus allowing the use of a lower power supply for reading the device, such as 3 V. Additionally, the overhead required to create the required negative read voltage is small for a flash EPROM wherein negative gate voltages are used for erase. This is because such circuits can now be used for both erase and read with different voltages. Furthermore, all the voltages needed for read, programming and erase can be generated using a single external power supply (e.g. 5 V), because the current consumption is small thereby enabling the use of charge pumps. If these voltages are regulated, then the operation of the cell can be made independent of power supply variations.

These and other objects and advantages of the present invention will become apparent to one of ordinary skill in the art after having read the following detailed description of a preferred embodiment which is illustrated in various figures.

BRIEF DESCRIPTION OF THE DRAWINGS

FIGS. 7(a) and 7(b) show flow charts illustrating a comparison of the overerase repair of the prior art to the present invention, respectively.

DETAILED DESCRIPTION OF THE PREFERRED EMBODIMENTS

The following detailed description is of the best modes presently contemplated by the inventor for practicing the invention. It should be understood that the descriptions of these preferred embodiments are merely illustrative and should not be taken as limiting.

Figure 1:
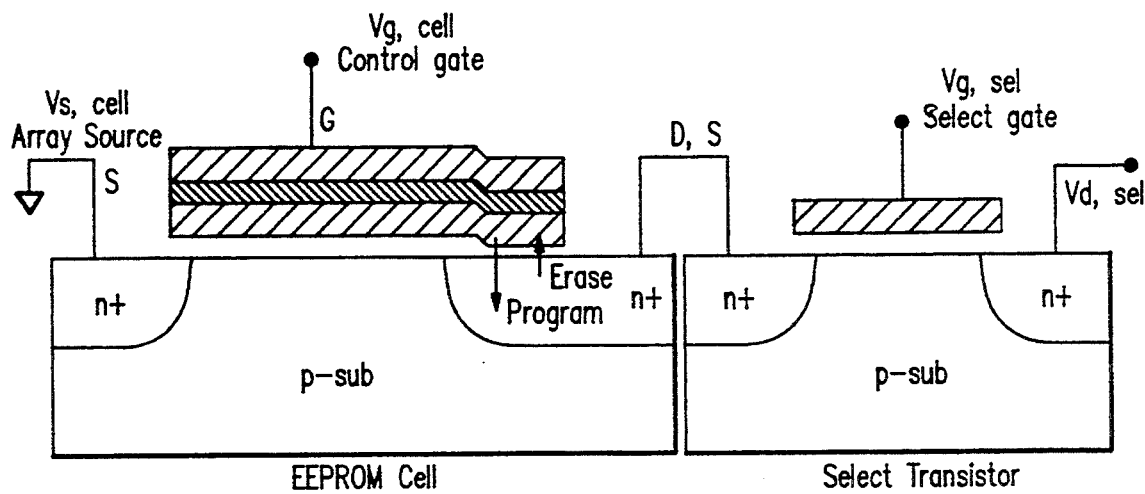
FIG. 1 is a cross-section drawing illustrating a prior art two-transistor EEPROM memory cell.
Figure 3:
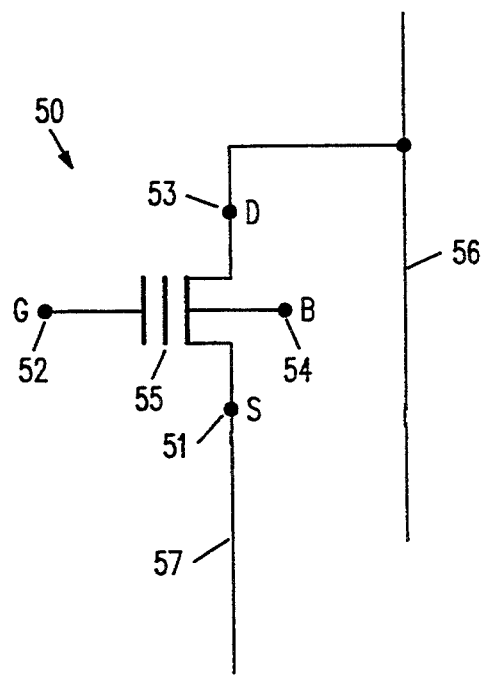
FIG. 3 is a simple schematic diagram illustrating a flash EPROM cell in accordance with the present invention.
Figure 2A:
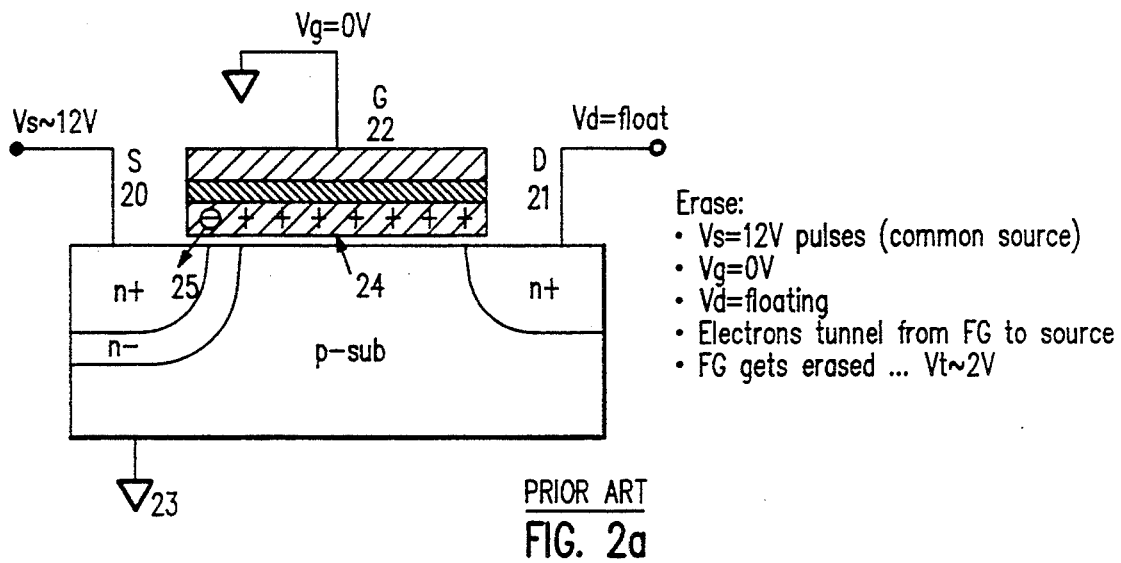
FIGS. 2(a)–2(c) show a cross-section drawing and bias conditions for, respectively, the erase, programming and read operations of a prior art single transistor flash EPROM memory cell which exhibits the overerase problem.
Figure 2B:
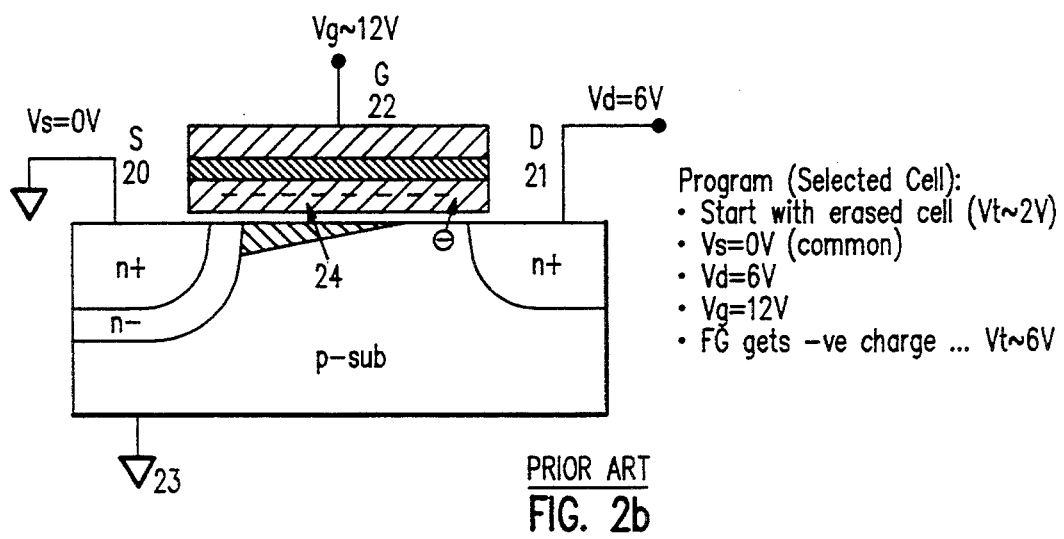
Figure 2C:
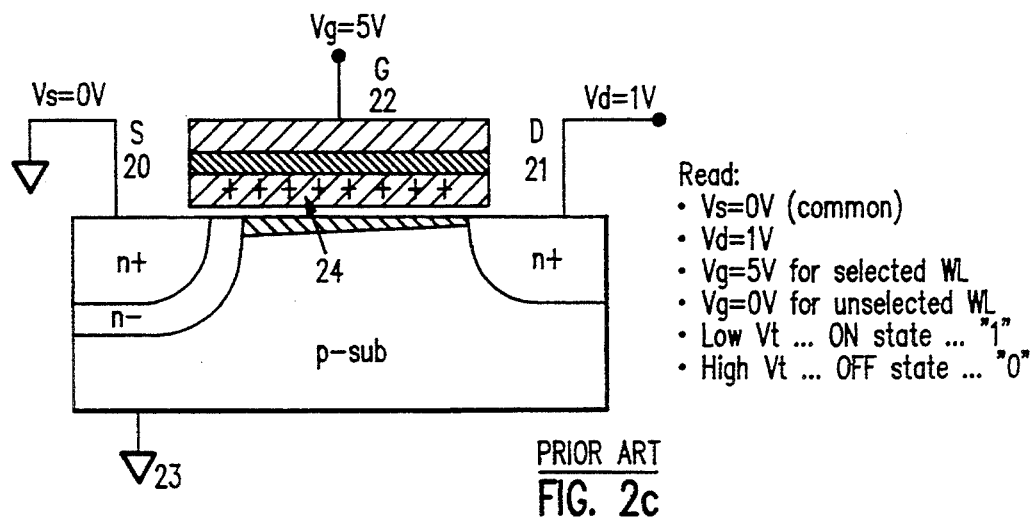

FIG. 3 shows a schematic diagram of a flash EPROM cell 50 in accordance with the present invention. The flash EPROM cell 50 includes a source 51, a control gate 52, a drain 53 and substrate 54.

Figure 4A:
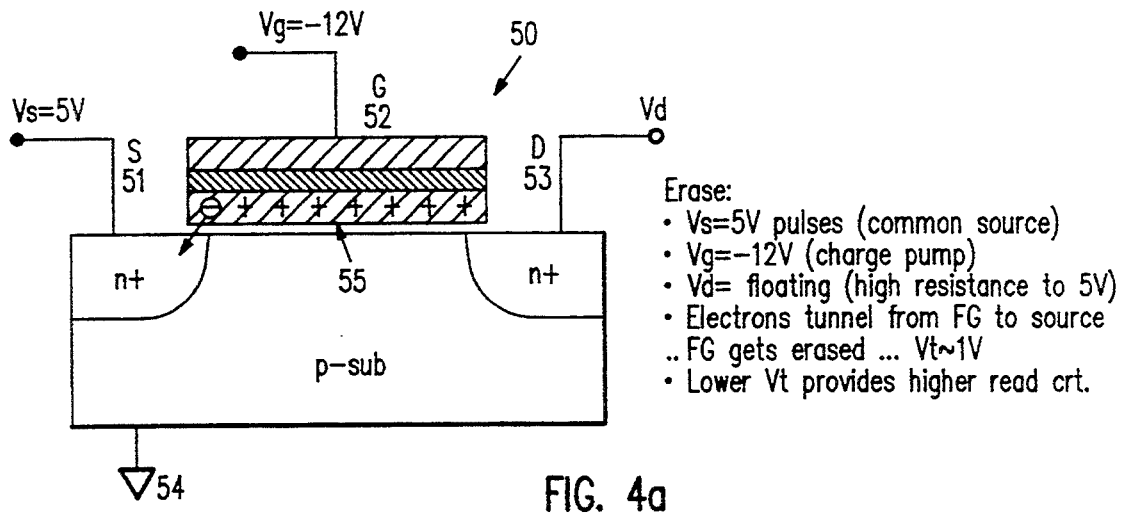
FIGS. 4(a)–4(c) show a cross-section and bias conditions for the erase, programming and read operations of the FIG. 3 cell.
Figure 4B:
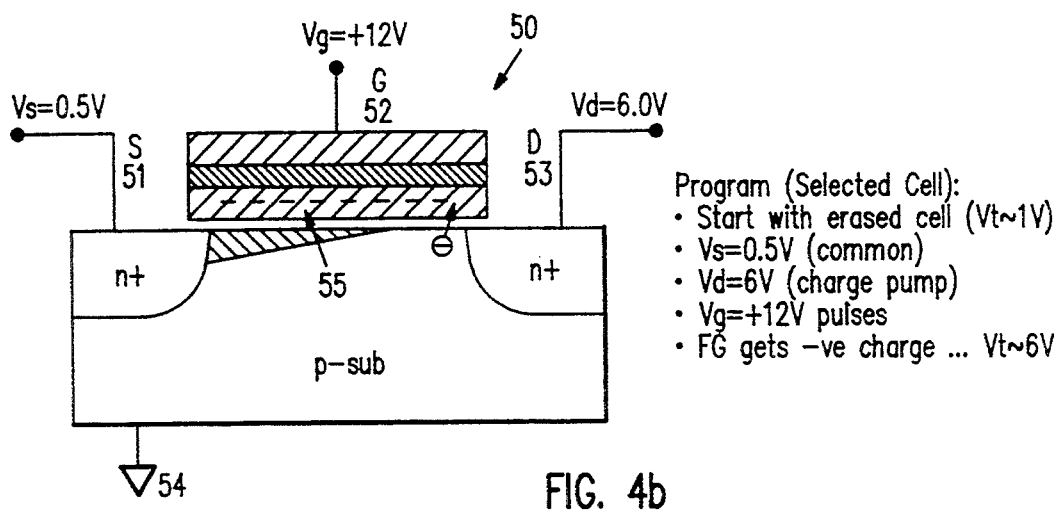
Figure 4C:
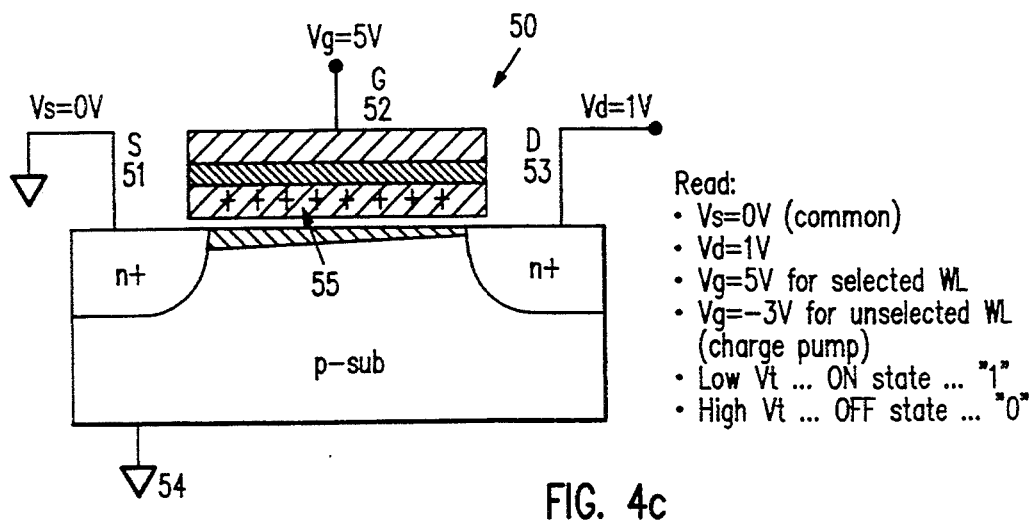

The concept presented herein can be used with a variety of different structures. FIGS. 4(a)–4(c) show a cross-section of the single transistor flash EPROM memory cell 50 in one of the implementations and respective bias conditions for erase, programming and read operations. A 0.6 μm generation technology has been assumed for illustration.

The cell 50 is fabricated in a substrate 54 of p-type silicon with a source region 51 optimized for the erase condition using a source implant and a drain region 53 optimized for hot electron programming. The source junction implant may be an As implant or a combination of As and P implants with typical values As, $1E15$–$6E15/cm^3$ at 50–80 KeV and P, $1E14$–$1E15/cm^3$ at 30–60 KeV. The channel program implant is a B implant, typically $1E12$–$1E13/cm^3$ at 30–60 KeV. Those skilled in the art will appreciate that the exact dose/energy of these implants should be optimized depending on back-end process temperature cycles. The thickness of the tunnel oxide over the channel is in the range of 75–100 Å, whereas the interpoly oxide thickness is in the range of 150–200 Å.

The read biasing condition is the key for eliminating the overerase problem. This condition is shown for the selected cell 50 in FIG. 4(c). The source 51 and substrate 54 are held at 0 V. The drain 53 is typically at 1 V and gate 52 is held at 5 V. If the cell is in a programmed state with its threshold voltage typically above 5.5 V, then the read current is very small, in the nA range. When the cell is in the erased state, the read current is high in the tens of μA's. For a deselected cell, the drain 53 is still at 1 V, but control gate 52 is held at a predetermined negative voltage chosen to keep the worst case cell in a nonconducting state even if the cell is in an erased state; a typical gate voltage for the unselected wordlines is −3 V.

The erase conditions are shown in FIG. 4(a). The present invention allows a larger gate voltage to be used, which results in a faster erase, as will be discussed in greater detail below. The typical bias conditions for the erase operation are source 51 at Vs of 5 V, control gate 52 at Vg of −12 V, with drain 53 floating and substrate 53 at 0 V. Note that this erases all of the cells along the connected wordline.

As shown in FIG. 4(b), during programming, unlike in the prior art, the source 51 is biased to a slightly positive voltage such as 0.5 V, the drain 53 is biased to 6 V, and the control gate 52 is biased to 12 V.

Those skilled in the art will appreciate that it is implied in the above discussion that application of the voltages can be done using pulses of short durations and that voltages can be modified depending on the technology scaling. The functionality of the flash EPROM cell thus remains unaffected, even if the overerased cells have negative threshold voltages, resulting in a superior flash EPROM cell compared to the prior art.

Table IV below shows a summary of the bias conditions for selected and unselected cells for various operations. The substrate voltage is zero for all operations.

Figure 5A:
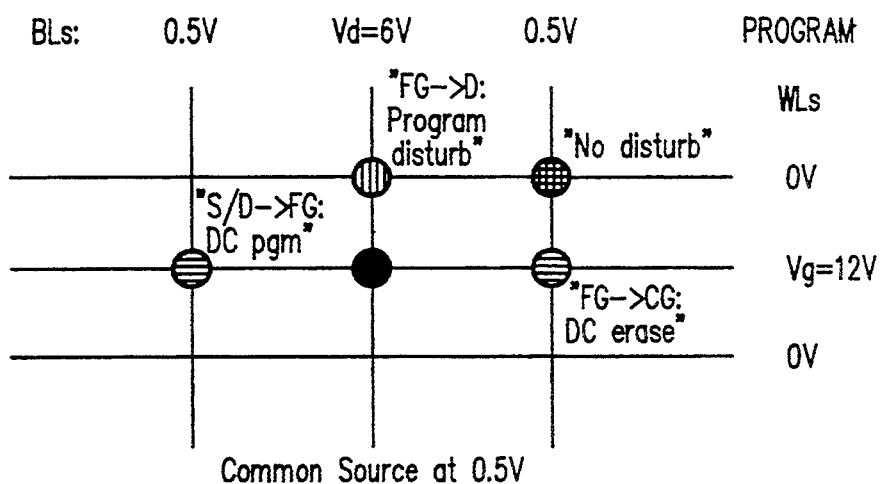
FIGS. 5(a)–5(c) show the various disturb conditions of the operation of the FIG. 3 cell.
Figure 5B:
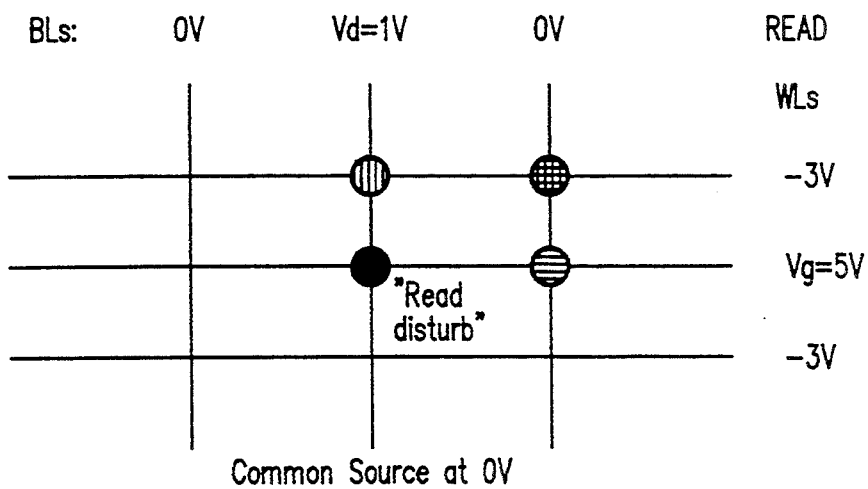
Figure 5C:
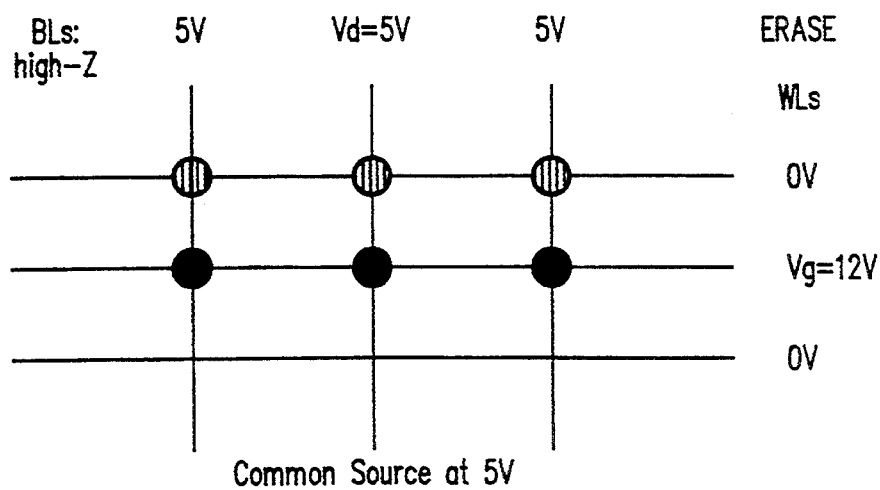

FIGS. 5(a)–5(c) show all the potential disturb conditions that can arise for the various cell operations. The solid dot represents a selected cell, whereas the non-solid dots represent deselected cells. That is, the solid dot represents the cells addressed to perform the desired function, while surrounding non-addressed (non-solid) cells encounter the "disturb" conditions. The design of the cell operating conditions and partitioning at the core determine the extent of disturb. To those familiar with the art, it should be clear from FIGS. 5(a)–(c), that these conditions do not cause any significant disturb problems.

TABLE IV

| | (Present invention) | | |
|---|---|---|---|
| | Vd Bitline | Vg Control Gate | VS Source |
| Read-select | 1 V | 5 V | 0 V |
| Read-desel | 0 V | −3 V | 0 V |
| Erase-select | 5 V-high Z | −12 V | 5 V |
| Erase-desel | 5 V-high Z | 0 V | 5 V |
| Program-sel | 6 V | 12 V | 0.5 V |
| Program-desel | 0.5 V | 0 V | 0.5 V |

Figure 6:
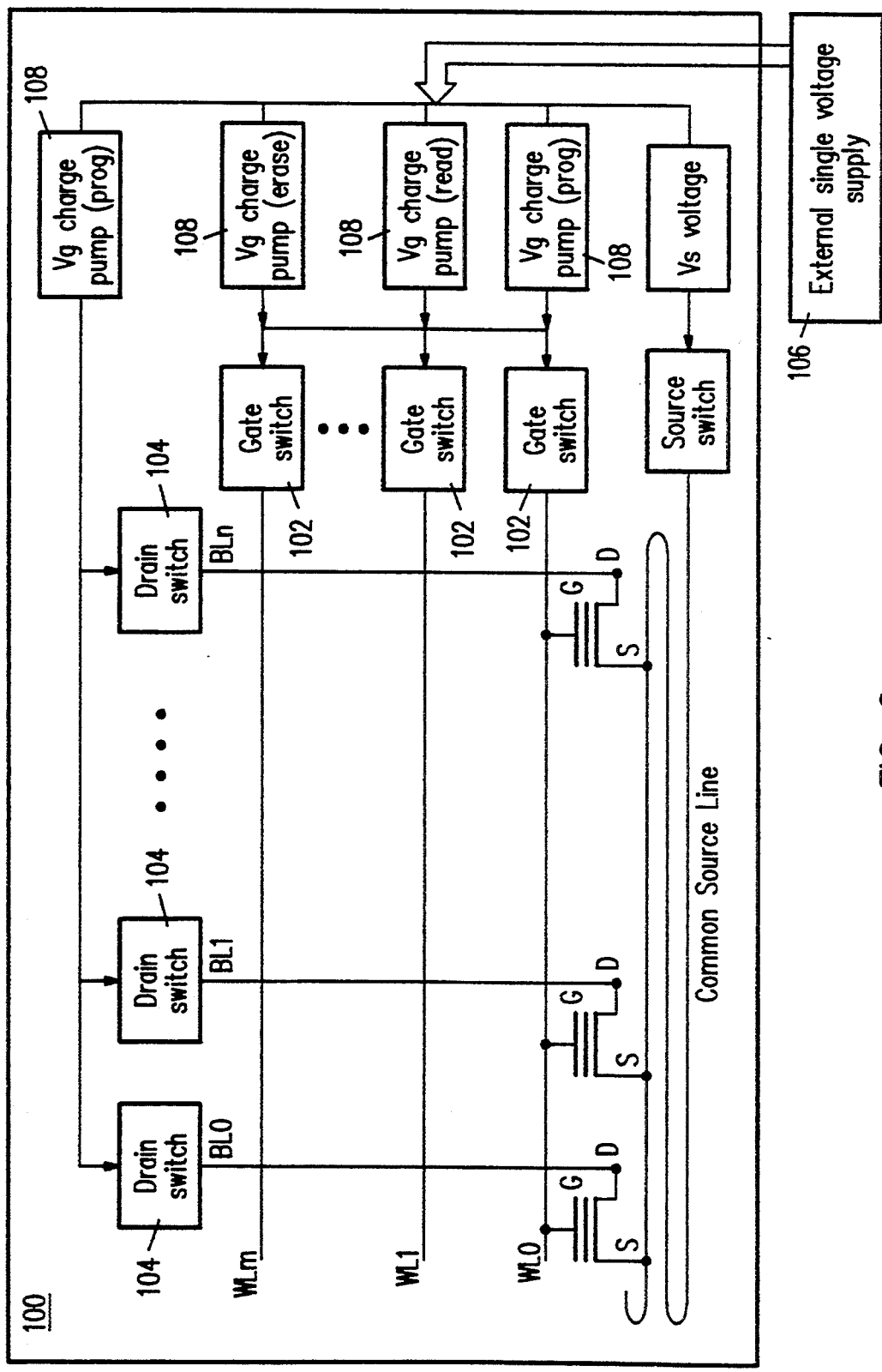
FIG. 6 is a block diagram illustrating a flash EPROM device in accordance with the present invention.

FIG. 6 is a block diagram showing an integrated circuit chip 100 that implements the above cell operation in a memory product. WL0, WL1 . . . WLm are all wordlines connected to the control gates 52 of the cells 50 driven by gate switches 102. Each of these gate switches 102 can supply appropriate voltage, as discussed above, to the control gates/wordlines. Similarly, BL0, BL1 . . . BLn are bit lines connected to the drains 53 of the cells 50 driven by the drain switches 104. Each of these drain switches 104 can supply appropriate voltage, as discussed above, to the drains/bitlines. All the voltages supplied to these switches, including the negative read voltage per this invention, are derived using a single external power supply 106, e.g., 5 V, and charge pumps 108.

The above-described flash EPROM cell and the read operating conditions allow the cell 50 to have many advantages over the prior art. For example, a wider distribution of the erased thresholds can be tolerated. In the prior art, a complicated scheme is used to ensure that the erased distribution is tight. An example of the scheme is shown in FIG. 7(a). Note that the prior art scheme requires all the cells to programmed first, erased next, and then repaired using an iterative scheme, before finally selectively programming the cells.

Since a wider erased threshold distribution can be tolerated in the present invention, a flow chart like that shown in FIG. 7(b) can be used to program the cells. In this case, neither initial cell programming nor iterative repair is required. This saves both programming time and die area in the product. For example, the absence of initial programming itself can save 10 μS/byte, which for an 8 MB flash EPROM translates to 10 seconds. The chip area of the memory product can be made smaller because additional circuitry to erase the cells by iterative schemes is not required. The non-iterative repair algorithm shown in FIG. 7(b), applies a small positive voltage, less than the nominal threshold voltage of the erased cell, to the gate creating a sub-threshold current. This current induces soft-avalanche programming, raises only the thresholds which are anomalously low and tightens the distribution. As stated above, a non-zero gate voltage has not been used in the prior art for repair (see K. Yoshikawa et. al. and U.S. Pat. No. 5,233,562, Ibid.).

It should be noted that no process modifications are required to the fabrication process to control the overerase of flash cells. In the prior art, floating poly doping has been adjusted to tighten the erased threshold distribution. This can potentially result in threshold voltage instability.

A major advantage of the present invention is that a higher negative gate voltage can be used to achieve faster erase. As is well known in the art, use of a larger negative gate voltage for erase results in a wider distribution of erased cell thresholds. This makes the overerase problem worse and can cause non-functionality of the cells due to negative thresholds. With the present invention, a larger erase gate voltage does not cause a detrimental problem.

A further advantage of the present invention is that the distribution of erased cell voltages can be lowered to a smaller average positive value, thus increasing the cell read current for given bias conditions, improving the access time and making the product faster. For example, in the priori art, an erased threshold distribution of 2 V±1.5 V can be utilized with a 5 V power supply, but not with a 3 V supply, assuming no pumped wordline voltage is being used. With the current invention, a 1±1.5 V distribution will not cause any functionality problems. A lower threshold voltage also gives larger cell read current for a given bias condition, which makes the product faster.

Another advantage of the invention is that redundant elements to repair rows or columns containing overerased cells are not required, because the overerased cells do not cause functionality problems.

Another advantage of the invention is that the overhead required to create the negative read voltage, e.g., −3 V, is small for a flash EPROM where negative gate voltages are used for erase. This is because such circuits can now be used for both erase and read with different voltages.

The negative voltage required for read can be generated using a charge pump from a single external power supply, e.g., 5 V, because current consumption is very small. The charge pumps can further be combined with the erase function. Also, if these voltages are regulated, then the operation of the cell can be made independent of the power supply variations.

Although the invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications that fall within the spirit and scope of the invention.

What is claimed is:

1. A flash EPROM memory cell array comprising:

a plurality of flash EPROM memory cells arranged as a matrix of rows and columns of said memory cells, each memory cell including a memory cell transistor having source and drain regions formed in a silicon substrate in spaced-apart relationship to define a channel region therebetween, a floating gate formed above the channel region to overlap the source and drain regions and separated therefrom by a layer of tunnel dielectric material, and a control gate formed above the floating gate and separated therefrom by a layer of inter-gate dielectric material;

for each row of flash memory cells in said matrix, a corresponding bit line connected to the drain region of each memory cell transistor in said row;

for each column of flash memory cells in said matrix, a corresponding word line connected to the control gate of each memory cell transistor in said column; and bias circuitry for applying read bias voltages to the array for reading data from a selected flash memory cell in said matrix, wherein said read bias circuitry includes means for applying a first control gate voltage to the word line connected to the control gate of said selected flash memory cell and a second control gate voltage to the word lines of the matrix excluding the word line associated with the selected flash memory cell, the first control gate voltage being positive and higher than the highest erased threshold voltage from the erased flash memory cell threshold voltage distribution and less than the lowest programmed threshold voltage from the programmed flash memory cell threshold distribution such that programmed flash memory cells connected to the selected wordline are shut off with insignificant drain current conduction, the second control gate voltage being less than the lowest erased threshold voltage such that erased cells connected to deselected wordlines are shut off with insignificant drain current conduction when said second control gate voltage is applied to the gates of said erased cells, even if said erased cells are overerased to negative threshold voltages.

2. A flash EPROM memory cell array as in claim 1 and wherein said second control gate voltage is a negative voltage.

3. A flash EPROM memory cell array as in claim 1 and wherein said bias circuitry includes means for applying an erase bias voltage to the array for taking away electron charge from the floating gate of cells to be erased such that the erased cell threshold voltage distribution is a low value, even though there may be distribution of such voltages going to negative values.

4. A flash EPROM memory cell array as in claim 3 and wherein said erased cell threshold voltage distribution average is close to the negative generated voltage.

5. A flash EPROM memory cell array as in claim 1 and wherein said bias circuitry incudes means for applying selective programming voltage to the bit lines of memory cells to be programmed for charging the floating gates of such memory cells such that the average cell threshold voltage is positive and at least one half of the positive supply voltage higher than the highest voltage from previous average erased threshold voltages.

6. A flash EPROM memory cell array as in claim 1 and further including repair bias circuitry for implementing a repair algorithm between erase and programming operations utilizing a positive control gate voltage which is less than the minimum programmed cell threshold voltage, utilizing zero volts applied to both the drain and substrate of cells to be repaired, and utilizing a positive voltage applied to the source of said cells.

7. A flash EPROM memory cell array as in claim 1 and further including repair bias circuitry for implementing a repair algorithm between erase and programming operations utilizing a positive control gate voltage which is less than the minimum programmed cell threshold voltage, utilizing zero volts applied to both the source and substrate of cells to be repaired, and utilizing a positive voltage applied to the drain of said cells.

8. A flash EPROM memory cell array as in claim 1 and wherein both the first and second control gate voltages are generated by a power supply external to said flash EPROM memory cell array.

9. A flash EPROM memory cell array as in claim 1 and wherein said first control gate voltage is between 0 V and a positive supply voltage (Vcc) provided to the array.

10. A flash EPROM memory cell array as in claim 1 and wherein said second control gate voltage is between −Vcc and 0 V.

11. A flash EPROM memory cell array as in claim 1 and wherein said tunnel oxide is less than about 100 Å.

12. A flash EPROM memory cell array as in claim 1 wherein said inter-gate oxide is thicker than said tunnel oxide.

13. A flash EPROM memory cell array as in claim 1 wherein said source is held at a positive voltage between 0 V and Vcc/5 V during programming.

* * * * *